(12) United States Patent
Yamazaki

(10) Patent No.: US 6,222,397 B1
(45) Date of Patent: Apr. 24, 2001

(54) OUTPUT CIRCUIT WITH SWITCHING FUNCTION

(75) Inventor: Kiyohiko Yamazaki, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/154,807

(22) Filed: Sep. 17, 1998

(30) Foreign Application Priority Data

Sep. 18, 1997 (JP) .................................................. 9-253178

(51) Int. Cl.$^7$ ......................................................... H03K 3/00
(52) U.S. Cl. ................................ 327/112; 326/57; 326/87
(58) Field of Search ................................ 326/56, 57, 58, 326/59, 60, 83, 85, 86, 87, 91; 327/108, 112

(56) References Cited

U.S. PATENT DOCUMENTS

| | | | | |
|---|---|---|---|---|
| 4,680,487 | * | 7/1987 | Kobayashi | 307/475 |
| 4,697,107 | * | 9/1987 | Haines | 307/474 |
| 5,208,492 | * | 5/1993 | Masumoto et al. | 307/469 |
| 5,306,965 | * | 4/1994 | Asprey | 307/448 |
| 5,530,379 | * | 6/1996 | Konishi et al. | 326/68 |
| 5,563,539 | * | 10/1996 | Takase | 327/185 |
| 5,811,997 | * | 9/1998 | Chengson et al. | 327/112 |
| 5,821,783 | * | 10/1998 | Torimaru et al. | 327/108 |
| 5,905,389 | * | 5/1999 | Alleven | 327/108 |
| 6,037,803 | * | 3/2000 | Klein | 326/86 |
| 6,040,714 | * | 3/2000 | Klein | 326/86 |

FOREIGN PATENT DOCUMENTS

| | | |
|---|---|---|
| 5-067961 | 3/1993 | (JP) . |
| 5-102829 | 4/1993 | (JP) . |
| 7-162284 | 6/1995 | (JP) . |

* cited by examiner

*Primary Examiner*—Jeffrey Zweizig
(74) *Attorney, Agent, or Firm*—Rabin & Champagne, P.C.

(57) ABSTRACT

An output circuit having a function of two or more external interfaces is disclosed. The disclosed output circuit has an input circuit generating an internal input signal in response to an external input signal, an output circuit including a pMOS transistor coupled between a positive potential source and an output terminal and an nMOS transistor coupled between a reference potential source and the output terminal. A gate of one of the transistors receives the internal input signal. The disclosed output circuit further has a control circuit receiving the internal input signal and the control signal and outputting an internal signal in response to the internal input signal and the control signal to a gate of the other one of the transistor. The control circuit outputs the internal input signal as the internal signal where the control signal has a first level. The control circuit outputs a predetermined level signal as the internal signal where the control signal has a second level so that the other one of the transistor has a predetermined state.

6 Claims, 6 Drawing Sheets

PRIOR ART

OUTPUT CIRCUIT WITH SWITCHING FUNCTION

BACKGROUND OF THE INVENTION

The present invention relates to an output circuit which is provided between the output of a first circuit and the input of a second circuit formed in an integrated circuit such as a semiconductor integrated circuit, and which outputs a signal of a level based on a signal supplied from the first circuit to the second circuit. Such an output circuit is usually provided in an integrated circuit. In this case, the second circuit is referred to as an external circuit or an external interface.

FIGS. 9 through 11 are circuit diagrams illustrating conventional output circuits employed for MOS integrated circuits. FIG. 9 shows a CMOS output circuit in which an output section is configured using a CMOS circuit composed of a pMOS transistor 103 and an nMOS transistor 104. FIG. 10 shows an nMOS open-drain type output circuit which employs the nMOS transistor 104 having an open drain electrode. FIG. 11 shows an nMOS pull-up drain type (nMOS open-drain type with a built-in pull-up device) output circuit in which an output section is composed of a pMOS transistor 302, which stays ON constantly, and an nMOS transistor 104 having the drain electrode thereof pulled up by the pMOS transistor 302. There are also available a pMOS open-drain type output circuit and a pMOS pull-down drain type (pMOS open-drain type with a built-in pull-up device) output circuit. The nMOS pull-up drain type and the pMOS pull-down drain type are referred to simply as pull-drain type. In FIG. 9 through FIG. 11, an input signal IN is applied to an input terminal "in" and transmitted to an input signal conductor 10 via an inverter 101. An output signal OUT is output through an output terminal "out."

The conventional output circuits set forth above are provided with signal output types, namely, CMOS type, open-drain type, and pull-drain type, and a driving capability to comply with the specifications of an external interface to be connected thereto. This has been posing a problem in that, when the external interface connected thereto is changed, the output circuit that has been used before the change cannot be used as it is, meaning that the internal circuitry of the output circuit has to be changed. There has been another problem in that, when two or more external interfaces are expected to be used, the same number of output circuits compatible with the respective external interfaces as that of two or more external interfaces must be prepared in advance.

SUMMARY OF THE INVENTION

The present invention has been made with a view toward solving the problems described above. It is an object of the present invention to provide an output circuit that can be applied to two or more external interfaces.

The output circuit according to the present invention has an input circuit generating an internal input signal in response to an external input signal, an output circuit including a pMOS transistor coupled between a positive potential source and an output terminal and an nMOS transistor coupled between a reference potential source and the output terminal. A gate of one of the transistors receives the internal input signal. The output circuit further has a control circuit receiving the internal input signal and the control signal and outputting an internal signal in response to the internal input signal and the control signal to a gate of the other one of the transistor. The control circuit outputs the internal input signal as the internal signal where the control signal has a first level. The control circuit outputs a predetermined level signal as the internal signal where the control signal has a second level so that the other one of the transistor has a predetermined state.

DETAILED DESCRIPTION OF THE PREFERRED EMBODIMENTS

Figure 1:
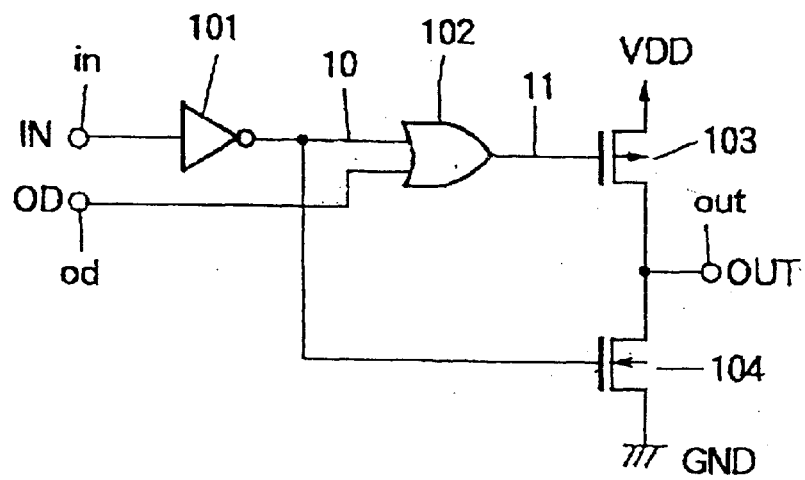
FIG. 1 is a circuit diagram showing an output circuit of a first embodiment in accordance with the present invention.

FIG. 1 is a circuit diagram showing an output circuit of a first embodiment in accordance with the present invention. The output circuit of FIG. 1 has a signal input terminal "in" to which an input signal IN is applied from outside, an inverter 101, a control terminal "od" to which a control signal OD is applied from outside, an OR gate 102 (logic gate), a pMOS transistor 103 (a first MOS transistor), an nMOS transistor 104 (a second MOS transistor), and a signal output terminal "out" connected to an external interface. The signal input terminal "in" and the inverter 101 constitute an input section which generates an internal input signal 10 based on the level of the input signal IN. The control terminal "od" and the OR gate 102 constitute a control section. Further, the pMOS 103 and nMOS 104 and the signal output terminal "out" make up an output section which outputs an output signal OUT based on the level of the internal input signal 10, that is, the output signal OUT based on the level of the input signal IN, to outside.

The input signal IN from outside is applied to the input of the inverter 101. The inverter 101 outputs the internal input signal 10, which is an inverted signal of the input signal IN. A first input of the OR gate 102 is connected to the output of the inverter 101, and the control signal OD from outside is applied to a second input of the OR gate 102. The OR gate 102 outputs an internal signal 11. The gate electrode of the pMOS 103 is connected to the output of the OR gate 102, the source electrode thereof is connected to a positive power supply VDD, and the drain electrode thereof is connected to the signal output terminal "out." The gate electrode of the nMOS 104 is connected to the output of the inverter 101, the source electrode thereof is connected to a reference power supply GND, and the drain electrode thereof is connected to the signal output terminal "out."

The control section sets the signal output mode of the output section to the CMOS type by applying the internal input signal 10 to the gate electrode of the pMOS 103 when the control signal OD indicates a first setting, while it sets the signal output mode of the output section to the open-drain type by holding the pMOS 103 OFF constantly and by applying the internal input signal 10 to the gate electrode of the nMOS 104 when the control signal OD indicates a second setting. The first setting means low level, and the second setting means high level. The input section may be constructed by only the input signal terminal "in" or by the signal input terminal "in" and a buffer, in which case the input signal IN serves as the internal input signal 10.

The operation of the output circuit of FIG. 1 will now be described. The operation implemented when the control signal OD is set at the low level will be described first. In this case, the OR gate 102 outputs the internal input signal 10, i.e. the inverted signal of the input signal IN, issued from the inverter circuit 101 as the internal signal 11. Hence, when the input signal IN switches to the low level, the pMOS 103 turns OFF, the nMOS 104 turns ON, and the output signal OUT switches to the low level. When the input signal IN switches to the high level, the pMOS 103 turns ON, the nMOS 104 turns OFF, and the output signal OUT switches to the high level. Thus, if the control signal OD is at the low level, then the output section works as a CMOS circuit composed of the pMOS 103 and the nMOS 104.

The operation implemented when the control signal OD is set at the high level will now be described. In this case, the internal signal 11 issued from the OR gate 102 is fixed to the high level regardless of the internal input signal 10. Therefore, the pMOS 103 is always OFF, and if the input signal IN switches to the low level, then the nMOS 104 turns OFF, while the nMOS 104 turns ON if the input signal IN switches to the high level. Thus, if the control signal OD is at the high level, then the output section works as an nMOS open-drain circuit based on the nMOS 104.

As set forth above, the first embodiment is equipped with the control section which has the OR gate 102 (logic gate) for controlling the PMOS 103 (the first MOS transistor) and which supplies the internal input signal 10 to the gate electrode of the nMOS 104 (the second MOS transistor) so as to switch the signal output mode of the output section between the CMOS type and the nMOS open-drain type by the control signal OD. Hence, even when the external interface is changed or a plurality of external interfaces are expected to be used, the circuit does not have to be changed since merely changing the setting of the control signal OD enables the circuit to adapt itself to a change of the external interface.

The internal composition of the control section for controlling the MOS transistors of the output section is not limited to the one shown in FIG. 1. For instance, the control section may be constructed by an inverter and a NAND gate instead of the OR gate 102, or it may alternatively be configured so as to accomplish changeover between the CMOS type and pMOS open-drain type. The output circuit adapted to perform changeover between the CMOS type and the pMOS open-drain type will be described in the following second embodiment.

Figure 2:
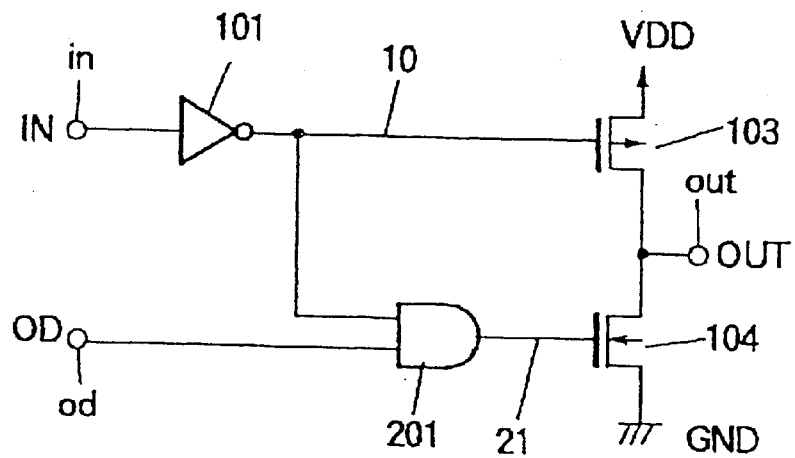
FIG. 2 is a circuit diagram showing an output circuit of a second embodiment in accordance with the present invention.

FIG. 2 is a circuit diagram showing an output circuit of the second embodiment in accordance with the present invention. In FIG. 2, the like components as those in FIG. 1 are given like reference numerals. The output circuit of FIG. 2 has a signal input terminal "in," an inverter 101, a control terminal "od," an AND gate 201 (logic gate), a pMOS transistor pMOS 103 (a second MOS transistor), an nMOS transistor nMOS 104 (a first MOS transistor), and a signal output terminal "out." The signal input terminal "in" and the inverter 101 constitute an input section. The control terminal "od" and the AND gate 201 constitute a control section. The pMOS 103 and nMOS 104 and the signal output terminal "out" make up an output section.

The output of the inverter 101 is connected to the gate electrode of the pMOS 103. In the control section, the first input of the AND gate 201 is connected to the output of the inverter 101, an external control signal OD is applied to the second input of the AND gate 201, and the output of the AND gate 201 is connected to the gate electrode of the nMOS 104.

The control section sets the signal output mode of the output section to the CMOS type by applying the internal input signal 10 to the gate electrode of the nMOS 104 when the control signal OD indicates a first setting, while it sets the signal output mode of the output section to the open-drain type by holding the nMOS 104 OFF constantly and by applying the internal input signal 10 to the gate electrode of the pMOS 103 when the control signal OD indicates a second setting. The first setting means high level, and the second setting means low level.

The operation of the output circuit of FIG. 2 will now be described. The operation implemented when the control signal OD is set at the high level will be described first. In this case, the AND gate 201 outputs the internal input signal 10, i.e. the inverted signal of the input signal IN, issued from the inverter circuit 101 as an internal signal 21. Hence, when the input signal IN switches to the high level, the nMOS 104 turns OFF and the pMOS 103 turns ON; or when the input signal IN switches to the low level, the nMOS 104 turns ON and the pMOS 103 turns OFF. Thus, if the control signal OD is at the high level, then the output section works as a CMOS circuit composed of the pMOS 103 and the nMOS 104.

The operation implemented when the control signal OD is set at the low level will now be described. In this case, the internal signal 21 issued from the AND gate 201 is fixed to the low level regardless of the internal input signal 10.

Therefore, the nMOS 104 is always OFF, and if the input signal IN switches to the high level, then the pMOS 103 turns OFF, while the pMOS 103 turns ON if the input signal IN switches to the low level. Thus, if the control signal OD is at the low level, then the output section works as a pMOS open-drain circuit based on the pMOS 103.

As set forth above, the second embodiment is equipped with the control section which has the AND gate 201 (logic gate) for controlling the nMOS 104 (the first MOS transistor) and which supplies the internal input signal 10 to the gate electrode. of the pMOS 103 (the second MOS transistor) so as to switch the signal output mode of the output section between the CMOS type and the pMOS open-drain type by the control signal OD. Hence, even when the external interface is changed or a plurality of external interfaces are expected to be used, the circuit does not have to be changed since merely changing the setting of the control signal OD enables the circuit to adapt itself to a change of the external interface.

The internal composition of the control section for controlling the MOS transistors of the output section is not limited to the one shown in FIG. 2. For instance, the control section may be constructed by an inverter and a NOR gate instead of the AND gate 201.

Figure 3:
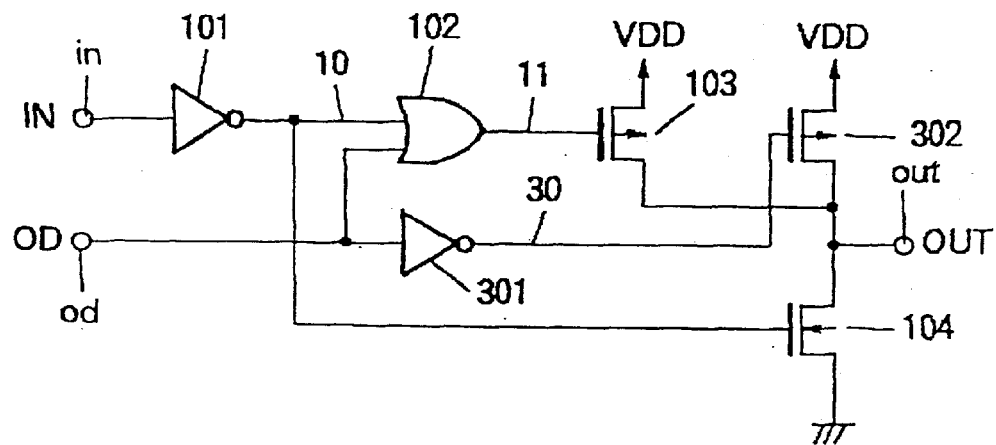
FIG. 3 is a circuit diagram showing an output circuit of a third embodiment in accordance with the present invention.

FIG. 3 is a circuit diagram showing the output circuit of a third embodiment in accordance with the present invention. In FIG. 3, the like components as those in FIG. 1 are given like reference numerals. The output circuit of FIG. 3 has a signal input terminal "in," an inverter 101, a control terminal "od," an OR gate 102 (logic gate), an inverter 301, a pMOS transistor 103 (a first MOS transistor) and a pMOS transistor 302 (a second MOS transistor), an nMOS transistor 104 (a third MOS transistor), and a signal output terminal "out." The control terminal "od," the OR gate 102, and the inverter 301 constitute a control section. The pMOS's 103 and 302 and nMOS 104 make up an output section. The output circuit shown in FIG. 3 has added the inverter 301 and the pMOS 302 added to the output circuit shown in FIG. 1.

The control signal OD is applied to the input of the inverter 301, and the inverter 301 outputs an internal signal 30, which is the inverted signal of the control signal OD. The gate electrode of the pMOS 302 is connected to the output of the inverter 301, the source electrode thereof is connected to a positive power supply VDD, and the drain electrode thereof is connected to the signal output terminal "out."

The control section sets the signal output mode of the output section to the CMOS type by applying the internal input signal 10 to the gate electrodes of the pMOS 103 and the nMOS 104 and by holding the pMOS 302 OFF constantly when the control signal OD indicates a first setting, while it sets the signal output mode of the output section to the pull-drain type by holding the pMOS 103 OFF constantly and the pMOS 302 ON and by applying the internal input signal 10 to the gate electrode of the nMOS 104 when the control signal OD indicates a second setting. The first setting means low level, and the second setting means high level.

The operation of the output circuit of FIG. 3 will now be described. The operation implemented when the control signal OD is set at the low level will be described first. In this case, the OR gate 102 outputs the internal input signal 10, i.e. the inverted signal of the input signal IN, issued from the inverter circuit 101 as an internal signal 11. The internal signal 30 is fixed to the high level. Hence, the pMOS 302 is always OFF, and when the input signal IN switches to the low level, the transistor pMOS 103 turns OFF and the nMOS 104 turns ON; or when the input signal IN switches to the high level, the pMOS 103 turns ON and the nMOS 104 turns OFF. Thus, if the control signal OD is at the low level, then the output section works as a CMOS circuit composed of the pMOS 103 and the nMOS 104.

The operation implemented when the control signal OD is set at the high level will now be described. In this case, the internal signal 11 is fixed to the high level, whereas the internal signal 30 is fixed to the low level. Therefore, the pMOS 103 stays OFF constantly, while the pMOS 302 stays ON constantly. If the input signal IN switches to the low level, then the nMOS 104 turns OFF, while the nMOS 104 turns ON if the input signal IN switches to the high level. Thus, if the control signal OD is at the high level, then the output section works as an nMOS pull-up drain circuit composed of the pMOS 302 and the nMOS 104, the pMOS 302 serving as a pull-up device.

As set forth above, the third embodiment is equipped with the control section which has the OR gate 102 (logic gate) for controlling the pMOS 103 (the first MOS transistor) and the inverter 301 for controlling the pMOS 302 (the second MOS transistor) and which supplies the internal input signal 10 to the gate electrode of the nMOS 104 (the third MOS transistor) so as to switch the signal output mode of the output section between the CMOS type and the nMOS pull-up drain type by the control signal OD. Hence, even when the external interface is changed or a plurality of external interfaces are expected to be used, the circuit does not have to be changed since merely changing the setting of the control signal OD enables the circuit to adapt itself to a change of the external interface.

The output circuit of FIG. 3 may be also configured to switch the signal output mode between the CMOS type and the pMOS pull-up drain type by replacing the OR gate 102 by an AND gate, the pMOS's 103 and 302 by an nMOS, and the nMOS 104 by a pMOS, and by inverting the positive power supply VDD and the reference power supply GND. The internal composition of the control section and the mode of supplying the control signal to the control section, i.e. the number of control signals supplied from outside, is not limited to the one shown in FIG. 3. For instance, the configuration illustrated in FIG. 3 is such that the internal signal for the pMOS 103 and the internal signal for the pMOS 302 are both generated by using the control signal OD; however, the control signal for the pMOS 103 and the control signal for the pMOS 302 may be supplied separately from outside. The output circuit adapted to separately supply the control signals for the pMOS's 103 and 302 from outside will be described in the following fourth embodiment.

Figure 4:
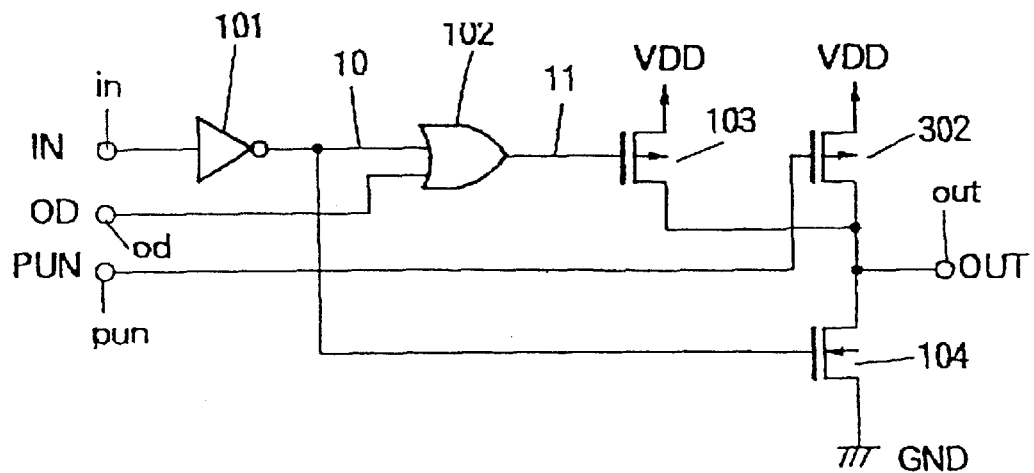
FIG. 4 is a circuit diagram showing an output circuit of a fourth embodiment in accordance with the present invention.

FIG. 4 is a circuit diagram showing the output circuit of the fourth embodiment in accordance with the present invention. In FIG. 4, the like components as those in FIG. 1 are given like reference numerals. The output circuit of FIG. 4 has a signal input terminal "in," an inverter 101, a control terminal "od" to which a control signal OD (a first control signal) is supplied from outside, a control terminal "pun" (a second control signal) to which a control signal PUN is supplied from outside, an OR gate 102 (logic gate), a pMOS transistor 103 (a first MOS transistor) and a pMOS transistor 302 (a second MOS transistor), an nMOS transistor 104 (a third MOS transistor), and a signal output terminal "out." The control terminals "od" and "pun" and the OR gate 102 constitute a control section. The pMOS's 103 and 302, the nMOS 104, and the signal output terminal "out" make up an output section. The output circuit shown in FIG. 4 has added the pMOS 302 to the output circuit shown in FIG. 1; it is different from the one shown in FIG. 3 that the control signal PUN instead of the inverted signal of the control signal OD is applied to the gate electrode of the pMOS 302.

The control section sets the signal output mode of the output section to the CMOS type by applying the internal input signal 10 to the gate electrodes of the pMOS 103 and the nMOS 104 and by holding the PMOS 103 OFF constantly when a control signal composed of the control signals OD and PUN indicates a first setting; it sets the signal output mode of the output section to the open-drain type by holding the pMOS's 103 and 302 OFF constantly and by applying the internal input signal 10 to the gate electrode of the nMOS 104 when the control signals are indicative of a second setting; and it sets the signal output mode of the output section to the pull-drain type by holding the pMOS 103 OFF constantly, while holding the pMOS 302 ON constantly, and by applying the internal input signal 10 to the gate electrode of the nMOS 104 when the control signals are indicative of a third setting. In this embodiment, the first setting applies when the control signal OD is at the low level and the control signal PUN is at the high level, the second setting applies when both the control signals OD and PUN are at the high level, and the third setting applies when the control signal OD is at the high level and the control signal PUN is at the low level.

The operation of the output circuit of FIG. 4 will now be described. The output circuit of FIG. 4 enables the control signal OD and the control signal PUN to be independently set. Four different settings are possible; however, it is not allowed to set the control signal OD and the control signal PUN to the low level at the same time.

The operation implemented when the control signal PUN is set at the high level will be described first. In this case, the pMOS 302 is always OFF. Hence, the output circuit of FIG. 4 operates the same as the output circuit of FIG. 1 according to the setting of the control signal OD. This means that, if the control signal OD is at the low level and the control signal PUN is at the high level, then the output section works as a CMOS circuit composed of the pMOS 103 and the nMOS 104. If the control signal OD and the control signal PUN are both at the high level, the output section works as an nMOS open-drain circuit based on the nMOS 104.

The operation implemented when the control signal OD is set at the high level and the control signal PUN is set at the low level will now be described. In this case, the pMOS 103 stays OFF constantly, while the pMOS 302 stays ON constantly. Hence, the output circuit of FIG. 4 operates the same as the output circuit of FIG. 3 when the control signal OD is set at the high level. More specifically, if the control signal OD is at the low level and the control signal PUN is at the high level, then the output section works as an nMOS pull-up drain circuit composed of the pMOS 302 and the nMOS 104, the pMOS 302 serving as the pull-up device.

As set forth above, the fourth embodiment is equipped with the control section which has the OR gate 102 (logic gate) for controlling the pMOS 103 (the first MOS transistor) according to the control signal OD (the first control signal) and which supplies the control signal PUN (the second control signal) to the gate electrode of the pMOS 302 (the second MOS transistor) and the internal input signal 10 to the gate electrode of the nMOS 104 (the third MOS transistor) so as to switch the signal output mode of the output section among the CMOS type, the nMOS open-drain type, and the nMOS pull-up drain type by the control signals OD and PUN. Hence, even when the external interface is changed or a plurality of external interfaces are expected to be used, the circuit does not have to be changed since merely changing the setting of the control signal OD enables the circuit to adapt itself to a change of the external interface.

As in the case of the third embodiment, the output circuit of FIG. 4 may be also configured to switch the signal output mode among the CMOS type, the pMOS open-drain type, and the pMOS pull-up drain type. The internal composition of the control section and mode in which the control signals are supplied to the control section are not limited to those shown in FIG. 4.

Figure 5:
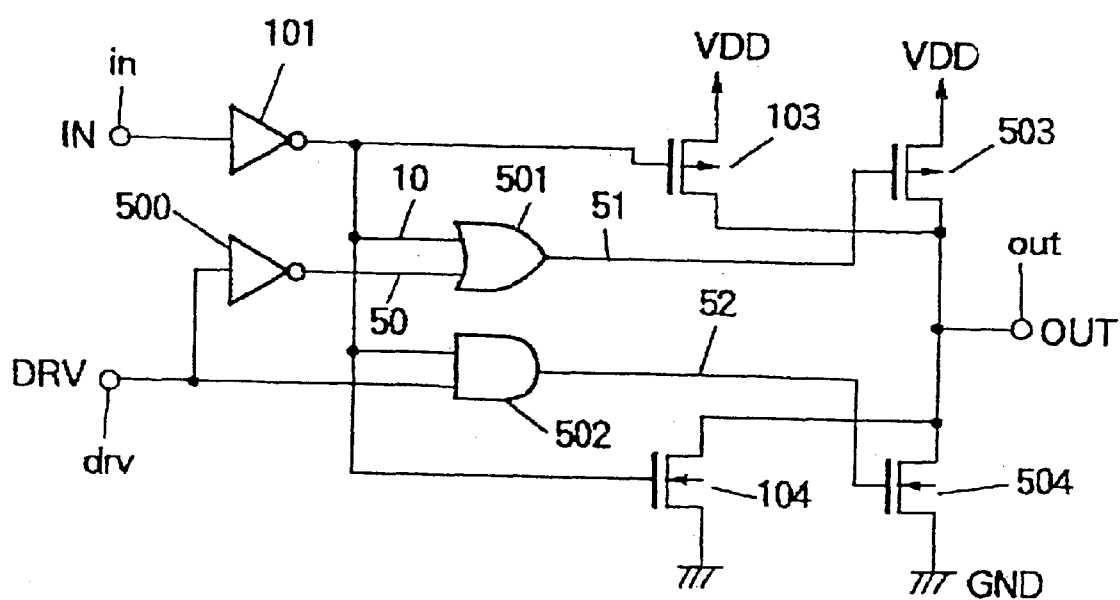
FIG. 5 is a circuit diagram showing an output circuit of a fifth embodiment in accordance with the present invention.

FIG. 5 is a circuit diagram showing the output circuit of a fifth embodiment in accordance with the present invention. In FIG. 5, the like components as those in FIG. 1 are given like reference numerals. The output circuit of FIG. 5 has a signal input terminal "in," an inverter 101, a control terminal "drv" to which a control signal DRV is applied from outside, an inverter 500 (a first inverter), an OR gate 501 (a first logic gate of the first type), an AND gate 502 (a first logic gate of the second type), pMOS transistors 103 and 503 (first and second MOS transistors of the first conductive type), nMOS transistors 104 and 504 (first and second MOS transistors of the second conductive type), and a signal output terminal "out." The control terminal "drv," the inverter 500, the OR gate 501, and the AND gate 502 constitute a control section. The pMOS's 103 and 503, and the nMOS's 104 and 504 make up an output section.

The control signal DRV is applied from outside to the input of the inverter 500, and the inverter 500 outputs an internal signal 50, which is the inverted signal of the control signal DRV. The first input of the OR gate 501 is connected to the output of the inverter 101, and the second input of the OR gate 501 is connected to the output of the inverter 500. The OR gate 501 outputs an internal signal 51. The first input of the AND gate 502 is connected to the output terminal of the inverter 101, and the control signal DRV is applied to the second input of the AND gate 502. The AND gate 502 issues an internal signal 52.

The gate electrode of the pMOS 103 is connected to the output of the inverter 101. The gate electrode of the pMOS 503 is connected to the output of the OR gate 501, the source electrode thereof is connected to the positive power supply VDD, and the drain electrode is connected to the signal output terminal "out." The gate electrode of the nMOS 104 is connected to the output of the inverter 101. The gate electrode of the nMOS 504 is connected to the output of the AND gate 502, the source electrode thereof is connected to a reference power supply GND, and the drain electrode is connected to the signal output terminal "out" of the nMOS 104.

The control section switches the driving capability of the CMOS output section by applying the internal input signal 10 to the gate electrodes of the pMOS 103 and the nMOS 104 and holding the pMOS 503 and the nMOS 504 OFF constantly when the control signal DRV indicates a first setting; or by applying the internal input signal 10 to the gate electrodes of the pMOS's 103 and 503, and the nMOS's 104 and 503 when the control signal DRV indicates the second setting. The first setting applies when the control signal DRV is at the low level, and the second setting applies when the control signal DRV is at the high level.

The operation of the output circuit of FIG. 5 will now be described. The operation implemented when the control signal DRV is set at the low level will be described first. In this case, the internal signal 52 issued from the AND gate 502 is fixed to the low level. The internal signal 50 issued from the inverter 500 switches to the high level, so that the internal signal 51 issued from the OR gate 501 is fixed to the high level. Hence, the pMOS 503 and the nMOS 504 are always OFF, and when the input signal IN switches to the low level, the transistor pMOS 103 turns OFF and the nMOS 104 turns ON; or when the input signal IN switches to the high level, the pMOS 103 turns ON and the nMOS 104 turns OFF. Thus, if the control signal DRV is at the low level, then the output section works as a CMOS circuit composed of the pMOS 103 and the nMOS 104.

The operation implemented when the control signal DRV is set at the high level will now be described. In this case, the OR gate 501 outputs the internal input signal 10, which has been issued from the inverter 101, as the internal signal 51, the internal signal 51 being the inverted signal of the input signal IN. The AND gate 502 outputs the internal signal 10 as the internal signal 52, the internal signal 52 being also the inverted signal of the input signal IN. Hence, if the input signal IN switches to the low level, then the pMOS's 103 and 503 turn OFF, while the nMOS's 104 and 504 turn ON. If the input signal IN switches to the high level, then the pMOS's 103 and 503 turn ON, while the nMOS's 104 and 504 turn OFF. Thus, if the control signal DRV is at the high level, then the output section works as a CMOS circuit composed of the pMOS's 103 and 503, and the nMOS's 104 and 504. The driving capability of the CMOS circuit when the control signal DRV is at the high level is higher than that of the CMOS circuit when the control signal DRV is at the low level.

As set forth above, the fifth embodiment is equipped with the control section which has the inverter 500 (the first inverter), the OR gate 501 (the first logic gate of the first type) for controlling the pMOS 503 (the second MOS transistor of the first conductive type), and the AND gate 502 (the first logic gate of the second type) for controlling the nMOS 504 (the second MOS transistor of the second conductive type) and which supplies the internal input signal 10 to the gate electrodes of the pMOS 103 (the first MOS transistor of the first conductive type) and the nMOS 104 (the first MOS transistor of the second conductive type) so as to switch the driving capability of the CMOS output circuit by the control signal DRV. Hence, even when the external interface is changed or a plurality of external interfaces are expected to be used, the circuit does not have to be changed since merely changing the setting of the control signal DRV enables the circuit to adapt itself to a change of the external interface.

The internal composition of the control section and the mode of supplying the control signal to the control section is not limited to the one shown in FIG. 5. As an alternative, a pMOS transistor and an nMOS transistor are respectively provided parallel to the pMOS 503 and the nMOS 504 of the output section, and a logic circuit generating the internal signals for controlling the transistors is provided in the control section so as to switch the driving capability of the output section in multiple stages. More specifically, the output section is configured to have a first to an N-th (where N is an integer of 2 or more) pMOS's and a first to the N-th nMOS's. The control section is configured to have: a first to an (N–1)th inverters to which a first to an (N–1)th control signals are respectively applied; a first to an (N–1)th OR gates which correspond to the first to the (N–1)th inverters and a second to an N-th pMOS's, respectively; and a first to an (N–1)th AND gates corresponding to the first to the (N–1)th control signals and the second to the N-th nMOS's. The control section is configured also to apply the internal input signal 10 to the gate electrodes of the first pMOS and the first nMOS. In this configuration, if the control signal composed of the first to the (N–1)th control signals is an i-th (where "i" is any integer from 1 to N) setting, then the internal input signal 10 is applied to the gate electrodes of the first to the i-th pMOS's and the first to the i-th nMOS's, and the (i+1)th to the N-th pMOS's and the (i+1)th to the N-th nMOS's are held OFF constantly, thereby switching the driving capability of the output section in multiple stages. As another alternative output circuit, the driving capability of the nMOS open-drain type output section thereof can be configured by removing the inverter 500, the OR gate 501, and the pMOS 103 and the pMOS 503 from the output circuit shown in FIG. 5, or still another alternative output circuit can be configured by removing the AND gate 502 and the nMOS 104 and the nMOS 504 from the output circuit shown in FIG. 5 so as to make it possible to switch the driving capability of a pMOS open-drain type output section. Further, the foregoing pMOS open-drain type output section may be provided with a pMOS transistor which serves as a pull-up device and which stays ON constantly to configure an output circuit capable of changing the driving capability of an nMOS pull-up drain type output section. Likewise, the foregoing nMOS open-drain type output section may be provided with an nMOS transistor which serves as a pull-down device and which stays ON constantly to configure an output circuit capable of changing the driving capability of a pMOS pull-down drain type output section.

Figure 6:
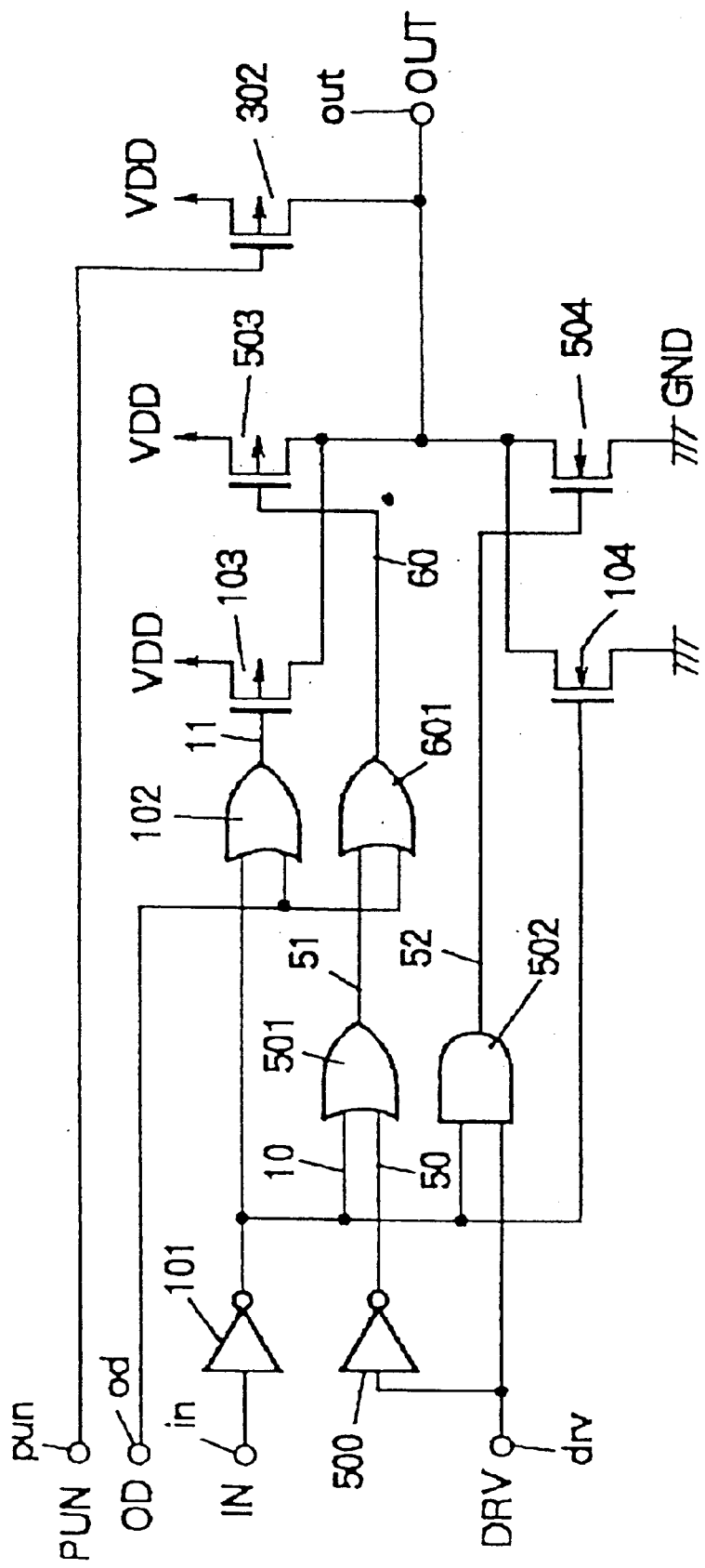
FIG. 6 is a circuit diagram showing an output circuit of a sixth embodiment in accordance with the present invention.

FIG. 6 is a circuit diagram showing the output circuit of a sixth embodiment in accordance with the present invention. In FIG. 6, the like components as those in FIG. 4 or 5 are given like reference numerals. The output circuit of FIG. 6 has a signal input terminal "in," an inverter 101, a control terminal "od" to which a control signal OD (a first control signal) is applied, a control terminal "drv" to which a control signal DRV (a second control signal) is applied, a control terminal "pun" to which a control signal PUN (a third control signal) is applied, an inverter 500, OR gates 102, 501, and 601 (first, second, and third logic gates), an AND gate 502 (a fourth logic gate), pMOS transistors 103, 503, and 302 (first, second, and third MOS transistors), nMOS transistors 104 and 504 (fourth and fifth MOS transistors), and a signal output terminal "out." The control terminals "od," "drv," and "pun," the OR gates 102, 501, and 601, and the AND gate 502 constitute a control section. The pMOS's 103, 302, and 503, and the nMOS's 104 and 504 make up an output section. The output circuit shown in FIG. 6 has added the control terminal "drv," the inverter 500, the OR gates 501 and 801, the AND gate 502, the pMOS 503, and the nMOS 504 to the output circuit shown in FIG. 4, or it has added the control terminals "od" and "pun," the OR gates 102 and 601, and the pMOS 302 to the output circuit shown in FIG. 5.

The first input of the OR gate 601 is connected to the output of the OR gate 501, and the control signal OD is applied to the second input of the OR gate 601. The OR gate 601 outputs an internal signal 60. The OR gates 501 and 601 may be replaced by a single OR gate in which the internal input signal 10 is applied to the first input thereof, the control signal OD is applied to the second input thereof, and the third input thereof is connected to the output of the inverter 500. The gate electrode of the pMOS 503 is connected to the output of the OR gate 601, the source electrode thereof is connected to a positive power supply VDD, and the drain electrode thereof is connected to the signal output terminal "out."

The control section sets the signal output mode of the output section to the CMOS type by applying the internal input signal 10 to the gate electrodes of the pMOS 103 and nMOS 104, and the second, third, and fifth MOS transistors are held OFF constantly when a control signal composed of the control signals OD, DRV, and PUN indicates a first setting. When the foregoing control signal indicates a second setting, the control section sets the output section to a CMOS type having a greater driving capability than that available at the first setting by applying the internal input signal 10 to the gate electrodes of the pMOS's 103 and 503, and nMOS's 104 and 504, and by holding the PMOS transistor 302 OFF constantly. When the foregoing control signal indicates a third setting, the control section sets the signal output mode of the output section to an open-drain type by holding the pMOS's 103, 503, and 302 and the nMOS 504 OFF constantly and by applying the internal input signal 10 to the gate electrode of the nMOS 104. When the foregoing control signal indicates a fourth setting, the control section holds the pMOS's 103, 503, and 302 OFF constantly and applies the internal input signal 10 to the gate electrodes of the nMOS's 104 and 504 so as to turn the output section into an open-drain type which has a greater driving capability than that available at the third setting. When the foregoing control signal indicates a fifth setting, the control section holds the first and second pMOS's 103 and 503, and a fifth nMOS 504 OFF constantly, whereas it holds the pMOS 302 ON constantly, and applies the internal input signal 10 to the gate electrode of the nMOS 104 so as to set the signal output mode of the output section to the pull-drain type. When the foregoing control signal indicates a sixth setting, the control section holds the pMOS's 103 and 503 OFF constantly, while it holds the pMOS 302 ON constantly and applies the internal input signal 10 to the gate electrodes of the nMOS's 104 and 504 so as to turn the output section into a pull-drain type which has a greater driving capability than that available at the fifth setting. In this embodiment, the first setting applies when the control signals OD and DRV are at the low level and the control signal PUN is at the high level; the second setting applies when the control signal OD is at the low level and both the control signals DRV and PUN are at the high level; the third setting applies when the control signal OD is at the high level, the control signal DRV is at the low level, an d the control signal PUN is at the high level; the fourth setting applies when the control signals OD, DRV, and PUN are at the high level; the fifth setting applies when the control signal OD is at the high level, and the control signals DRV and PUN are at the low level; and the sixth setting applies when the control signals OD and DRV are at the high level, and the control signal PUN is at the low level.

The operation of the output circuit of FIG. 6 will now be described. The output circuit of FIG. 6 enables the control signal OD, the control signal PUN, and the control signal DRV to be independently set. Eight different settings are possible; however, it is not allowed to set the control signal OD and the control signal PUN to the low level at the same time.

The operation implemented when the control signal OD is set at the low level, the control signal PUN is set at the high level, and the control signal DRV is set at the low level will be described first. Since the control signal PUN is at the high level, the pMOS 302 stays OFF constantly. Also, since the control signal DRV is at the low level, the internal signal 52 is fixed to the low level, and the internal signals 50, 51, and 60 are fixed to the high level. Hence, the pMOS 503 and the nMOS 504 also stays OFF constantly. Since the control signal OD is at the low level, the internal signal 11 is the inverted signal of the input signal IN. Accordingly, if the input signal IN switches to the low level, then the PMOS 103 turns OFF and the nMOS 104 turns ON. If the input signal IN switches to the high level, then the pMOS 103 turns ON and the nMOS 104 turns OFF. Thus, the output circuit of FIG. 6 at this setting acts the same as the output circuit of FIG. 4 when the control signal OD is at the low level and the control signal PUN is at the high level. This means that, if the control signal OD and the control signal DRV are at the low level and the control signal PUN is at the high level, then the output section works as a CMOS circuit composed of the pMOS 103 and the nMOS 104.

The operation implemented when the control signal OD is set at the low level, while the control signal PUN and the control signal DRV are set at the high level will now be described. In this case, the pMOS 302 is always OFF. Since the control signal DRV is at the high level, the internal signals 51 and 52 become the inverted signals of the input signal IN, and since the control signal OD is at the low level, the internal signals 11 and 60 also become the inverted signals of the input signal IN. Hence, if the input signal IN switches to the low level, then the pMOS's 103 and 503 turn OFF, while the nMOS's 104 and 504 turn ON. If the input signal IN switches to the high level, then pMOS's 103 and 503 turn ON, while the nMOS's 104 and 504 turn OFF. Thus, if the control signal OD is at the low level, and the control signal PUN and the control signal DRV are at the high level, then the output section works as a CMOS circuit composed of the pMOS's 103 and 503 and the nMOS's 104 and 504. The driving capability of the CMOS circuit when the control signal DRV is at the high level is higher than that of the CMOS circuit when the control signal DRV is at the low level.

The operation implemented when the control signal OD and the control signal PUN are set at the high level, while the control signal DRV is set at the low level will now be described. Since the control signal PUN is at the high level, pMOS 302 is always OFF. Since control signal OD is at the high level, the internal signals 11 and 60 are fixed at the high level, and the pMOS's 103 and 503 are OFF constantly. Also, since the control signal DRV is at the low level, the internal signal 52 is fixed to the low level, and the nMOS 504 is OFF constantly. Hence, the output circuit of FIG. 6 at this setting works the same as the output circuit of FIG. 4 when the control signal OD and the control signal PUN are at the high level. More specifically, when the control signal OD and the control signal PUN are at the high level, while the control signal DRV is at the low level, then the output section works as an nMOS open-drain circuit based on the nMOS 104.

The operation implemented when the control signal OD, the control signal PUN, and the control signal DRV are all set at the high level will now be described. In this case, the pMOS's 103, 503, and 302 stay OFF constantly. The AND gate 502 outputs the internal input signal 10 from the inverter 101 as the internal signal 52, the internal signal 52 being the inverted signal of the input signal IN. Hence, the nMOS's 104 and 504 turn OFF when the input signal IN switches to the low level, while they turn ON when the input signal IN switches to the high level. Thus, if the control signal OD, the control signal PUN, and the control signal DRV are all at the high level, then the output section works as an nMOS open-drain circuit composed of the nMOS's 104 and 504. The driving capability of the nMOS open-drain circuit when the control signal DRV is at the high level is higher than that of the nMOS open-drain circuit when the control signal DRV is at the low level.

The operation implemented when the control signal OD is set at the high level, while the control signal PUN and the control signal DRV are set at the low level will now be described. Since the control signal PUN is at the low level, pMOS 302 stays ON constantly. Since the control signal OD is at the high level, while the control signal DRV is at the low level, the pMOS's 103 and 503 and the nMOS 504 stay OFF constantly. Hence, the output circuit of FIG. 6 at this setting works the same as the output circuit of FIG. 4 when the control signal OD is at the high level and the control signal PUN is at the low level. More specifically, if the control signal OD is at the high level, while the control signal PUN and the control signal DRV are at the low level, then the output section works as an nMOS pull-up drain circuit composed of the pMOS 302 and the nMOS 104, the pMOS 302 being the pull-up device.

The operation implemented when the control signal OD is set at the high level, the control signal PUN is set at the low level, and the control signal DRV is set at the high level will now be described. In this case, the pMOS 302 stays ON constantly, while the pMOS's 103 and 503 stay OFF constantly. The internal signal 52 becomes the inverted signal of the input signal IN. Therefore, if the input signal IN switches to the low level, then the nMOS's 104 and 504 turn ON, or if the input signal IN switches to the high level, then the nMOS's 104 and 504 turn OFF. Thus, if the control signal OD and the control signal DRV are at the high level, and the control signal PUN is at the low level, then the output section works as an nMOS pull-up drain circuit composed of the pMOS 302 and the nMOS's 104 and 504, the pMOS 302 serving as the pull-up device. The driving capability of the nMOS pull-up drain circuit when the control signal DRV is at the high level is higher than that of the nMOS pull-up drain circuit when the control signal DRV is at the low level.

As set forth above, the sixth embodiment is equipped with the control section which has: the OR gate 102 (the first logic gate) for controlling the pMOS 103 (the first MOS transistor) in accordance with the control signal OD (the first control signal); the inverter 500, the OR gate 501 (the second logic gate), and the OR gate 801 (the third logic gate) for controlling the pMOS 503 (the second MOS transistor) in accordance with the control signal OD and the control signal DRV (the second control signal); and the AND gate 502 (the fourth logic gate) for controlling the nMOS 504 (the fifth MOS transistor) in accordance with the control signal DRV. The control section applies the control signal PUN (the third control signal) to the gate electrode of the pMOS 302 (the third MOS transistor) and applies the internal input signal 10 to the gate electrode of the nMOS 104 (the fourth MOS. transistor) so as to be able to switch the output mode of the output section among the CMOS type, the nMOS open type, and the nMOS pull-up type in accordance with the control signal OD and the control signal PUN and also to switch the driving capability in each of the signal output modes in accordance with the control signal DRV. Hence, even when the external interface is changed and the signal output mode or the required driving capability is changed, or a plurality of external interfaces of different signal output modes or driving capabilities are expected to be used, the circuit does not have to be changed since merely changing the settings of the control signals OD, DRV, and PUN enables the circuit to adapt itself to a change of the external interface.

The internal composition of the control section and the input mode of the control signals supplied to the control section are not limited to those shown in FIG. 6. It is also possible to accomplish a configuration that permits changeover among the CMOS type, the pMOS open-drain type, and the pMOS pull-up drain type.

It is also possible to accomplish a configuration that permits changeover of the signal output mode to the CMOS type or the nMOS open-drain type and that also permits changeover of the driving capability in each signal output mode. To be more specific, the output circuit of FIG. 6 is configured so that the control terminal "pun" and the pMOS 302 are removed, the output section thereof is composed of the pMOS's 103 and 503 (the first and second MOS transistors) and the nMOS's 104 and 504 (the third and fourth MOS transistors), and the control section thereof is composed of the inverter 500, the OR gate 102 (the first logic gate), the OR gates 501 and 601 (these two OR gates make up the second logic gate), and the AND gate 502 (the third logic gate). This configuration makes it possible to set the signal output mode of the output section to the CMOS type by applying the internal input signal 10 to the gate electrodes of the pMOS 103 and the nMOS 104 and by holding the pMOS 503 and the nMOS 504 OFF constantly when the control signal constituted by the control signals OD and DRV indicates the first setting. When the control signal indicates the second setting, the internal input signal 10 is applied to the gate electrodes of the pMOS's 103 and 503 and the nMOS's 104 and 504, thus making it possible to turn the output section into the CMOS type having a greater driving capability than that available with the first setting. When the control signal indicates the third setting, the pMOS's 103 and 503, and the nMOS 504 are held OFF constantly, the pMOS 302 is held ON constantly, and the internal input signal 10 is applied to the gate electrode of the nMOS 104, thus making it possible to set the signal output mode of the output section to the nMOS open-drain type. When the control signal indicates the fourth setting, the pMOS's 103 and 503 are held OFF constantly and the internal input signal 10 is applied to the gate electrodes of the nMOS's 104 and 504, thus making it possible to turn the output section to be the nMOS open-drain type providing a greater driving capability than that available at the third setting.

It is also possible to implement a configuration that permits changeover of the signal output mode to the CMOS type or the nMOS pull-up drain type and that also permits changeover of the driving capability in each signal output mode. To be more specific, the output circuit of FIG. 6 is configured so that the control terminal "pun" is removed, an inverter (a second inverter) for inverting the control signal OD is provided, the gate electrode of the pMOS 302 is connected to the output of the second inverter, and the control section thereof is composed of the inverter 500 (the first inverter), the foregoing second inverter, the OR gate 102 (the first logic gate), the OR gates 501 and 601 (these two OR gates make up the second logic gate), and the AND gate 502 (the third logic gate). This configuration makes it possible to set the signal output mode of the output section to the CMOS type by applying the internal input signal 10 to the gate electrodes of the pMOS 103 and the nMOS 104 and by holding the pMOS's 503 and 302, and the nMOS 504 OFF constantly when the control signal constituted by the control signals OD and DRV indicates the first setting. When the control signal indicates the second setting, the internal input signal 10 is applied to the gate electrodes of the pMOS's 103 and 503 and the nMOS's 104 and 504, thus making it possible to turn the output section into the CMOS type having a greater driving capability than that available with the first setting. When the control signal indicates the third setting, the pMOS's 103 and 503, and the nMOS 504 are held OFF constantly and the internal input signal 10 is applied to the gate electrode of the nMOS 104, thus making it possible to set the signal output mode of the output section to the nMOS pull-up drain type. When the control signal indicates the fourth setting, the pMOS's 103 and 503 are held OFF constantly, while the pMOS 302 is held ON constantly, and the internal input signal 10 is applied to the gate electrodes of the nMOS's 104 and 504, thus making it possible to turn the output section to be the nMOS pull-up drain type providing a greater driving capability than that available at the-third setting.

The output circuit of FIG. 6 is configured so as to make it possible to switch the signal output mode and the driving capability independently. Alternatively, however, the output circuit may be configured so as to enable the signal output mode and the driving capability to be switched at the same time by using a single control signal. A seventh embodiment set forth below represents the output circuit that switches the driving capability at the same time when the signal output mode is switched from the CMOS type to the open-drain type.

Figure 7:
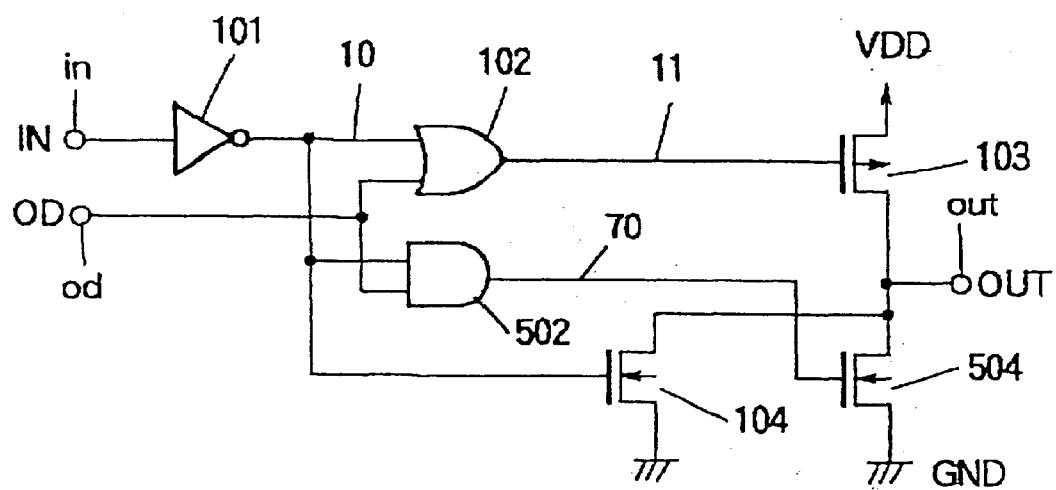
Fig. 7 is a circuit diagram showing an output circuit of a seventh embodiment in accordance with the present invention.

FIG. 7 is a circuit diagram showing the output circuit of the seventh embodiment in accordance with the present invention. In FIG. 7, like components as those shown in FIG. 1 and FIG. 5 are assigned like reference numerals. The output circuit of FIG. 7 has a signal input terminal "in," an inverter 101, a control terminal "od," an OR gate 102 (a first logic gate), an AND gate 502 (a second logic gate), a pMOS transistor 103 (a first MOS transistor), a nMOS transistors 104 and 504 (second and third MOS transistors), and a signal output terminal "out." The control terminal "od," the OR gate 102, and the AND gate 502 constitute a control section. The pMOS 103 and the nMOS's 104 and 504 constitute an output section. The output circuit of FIG. 7 has added the AND gate 502 and the nMOS 504 to the output circuit of FIG. 1.

A first input of the AND gate 502 is connected to the output of the inverter 101, and a control signal OD is applied to a second input of the AND gate 502. The AND gate 502 outputs an internal input signal 70. The gate electrode of the nMOS 504 is connected to the output of the AND gate 502, the source electrode thereof is connected to a reference power supply GND, and the drain electrode thereof is connected to the signal output terminal "out."

When the control signal OD indicates a first setting, the control section applies the internal input signal 10 to the gate electrodes of the pMOS 103 and nMOS 104 to hold the nMOS 504 OFF constantly, thereby turning the output section into the CMOS type. Likewise, when the control signal OD indicates a second setting, the control section holds the pMOS 103 OFF constantly, and applies the internal input signal 10 to the gate electrodes of the nMOS's 104 and 504, thereby turning the output section into the open-drain type which provides a greater driving capability than that available at the first setting. In this embodiment, the first setting applies when the control signal OD is at the low level, and the second setting applies when the control signal OD is at the high level.

The operation of the output circuit of FIG. 7 will be described. The operation carried out when the control signal OD has been set at the low level will be described first. In this case, an internal input signal 60 issued from the AND gate 502 is fixed to the low level, and the nMOS 504 stays OFF constantly. Hence, the output circuit of FIG. 7 at this setting acts the same as the output circuit of FIG. 1 when the control signal OD is at the low level. In other words, when the control signal OD is at the low level, the output section works as a CMOS circuit composed of the pMOS 103 and the nMOS 104.

The operation carried out when the control signal OD has been set at the high level will now be described. In this case, an internal signal 11 issued from the OR gate 102 is fixed to the high level. The AND gate 502 issues the internal input signal 10 from the inverter 101 as the internal input signal 70, and the internal input signal 70 becomes the inverted signal of the input signal IN. Accordingly, the pMOS 103 stays OFF constantly, and the nMOS's 104 and 504 turn OFF when the input signal IN switches to the low level, while they turn ON when the input signal IN switches to the high level. Thus, when the control signal OD is at the high level, the output section operates as an nMOS open-drain circuit composed of the nMOS's 104 and 504. When the output section works as the nMOS open-drain circuit, the driving capability of the nMOS is higher than that of the nMOS available when the output section works as a CMOS circuit.

As set forth above, the seventh embodiment is equipped with the control section which has the OR gate 102 (the first logic gate) for controlling the pMOS 103 (the first MOS transistor) and the AND gate 502 (the second logic gate) for controlling the nMOS 504 (the third MOS transistor), and which applies the internal input signal 10 to the gate electrode of the nMOS 104 (the second MOS transistor) so as to be able to switch the signal output mode of the output section to the CMOS type or the nMOS open-drain type by the control signal OD and also to switch the driving capability at the same time whenever the signal output mode is switched. Hence, even if the nMOS of the output section is required to provide a higher driving capability when the output circuit works as the nMOS open-drain type than that when it works as a CMOS type, optimum driving capabilities can be set for each type.

The internal composition of the control section and the input mode of the control signals supplied to the control section are not limited to those shown in FIG. 7. It is also possible to accomplish a configuration that permits changeover between the CMOS type and the pMOS open-drain type having different driving capabilities. In the case of the output circuit of FIG. 7, the driving capability of the nMOS of the output section when the output section works as the CMOS type is higher than that when the output section works as the open-drain type; however, the output circuit can alternatively be configured so that the driving capability of the nMOS of the output section when the output section works as the open-drain type is higher than that when the output section works as CMOS type. The output circuit in which the driving capability is higher when it works as the open-drain type than it works as the CMOS will be described in terms of an eighth embodiment given below.

Figure 8:
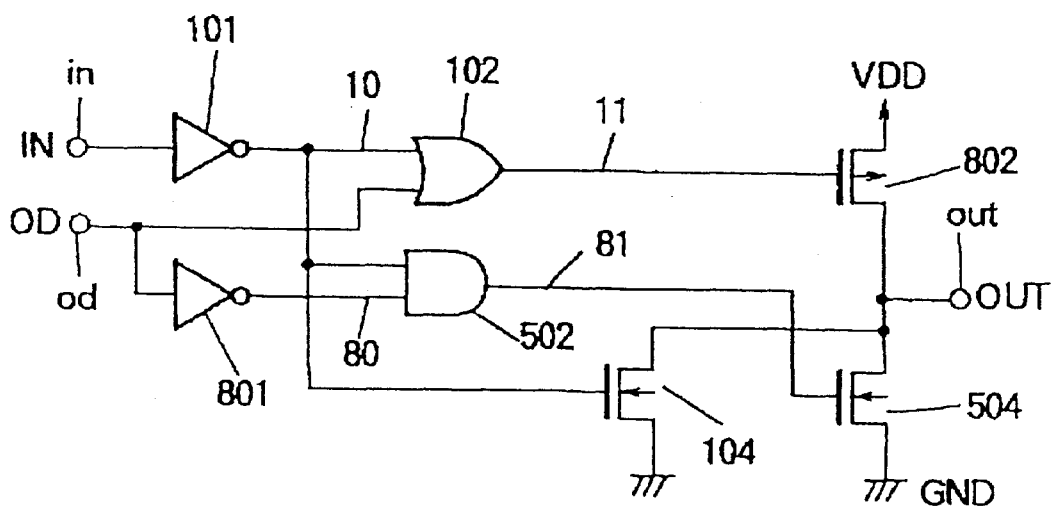
FIG. 8 is a circuit diagram showing an output circuit of an eighth embodiment in accordance with the present invention.
Figure 9:
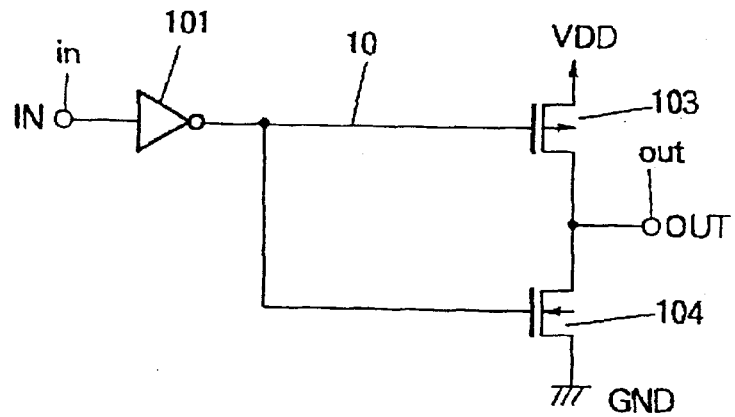
FIG. 9 is a circuit diagram showing a conventional CMOS output circuit.
Figure 10:
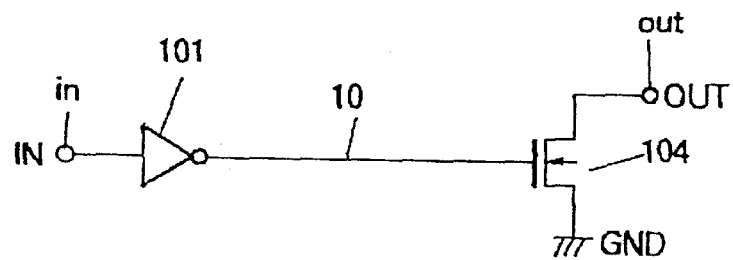
FIG. 10 is a circuit diagram showing a conventional open-drain type output circuit.
Figure 11:
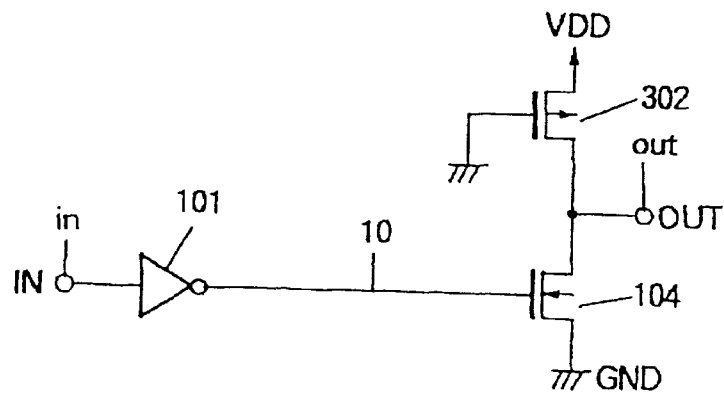
FIG. 11 is a circuit diagram showing a conventional pull-up drain type output circuit.

FIG. 8 is a circuit diagram showing the output circuit of an eighth embodiment in accordance with the present invention. In FIG. 8, like components as those shown in FIG. 1 and FIG. 6 are assigned like reference numerals. The output circuit of FIG. 8 has a signal input terminal "in," an inverter 101, a control terminal "od," an inverter 801, an OR gate 102 (a first logic gate), an AND gate 502 (a second logic gate), a pMOS transistor 802 (a first MOS transistor), nMOS transistors 104 and 504 (second and third MOS transistors), and a signal output terminal "out." The control terminal "od," the inverter 801, the OR gate 102, and the AND gate 502 make up a control section. The pMOS 802 and nMOS's 104 and 504 make up an output section. The output circuit of FIG. 8 has added the inverter 801, the AND gate 502, and the nMOS 504 to the output circuit of FIG. 1, and has replaced the pMOS 103 by the pMOS 802 which provides a higher driving capability than the pMOS 103. The pMOS 802 may be substituted by the pMOS 103 and the pMOS 503 of FIG. 5 which are connected in parallel.

A control signal OD is supplied to the input of the inverter 801, and the output of the inverter 801 is connected to a first input of the AND gate 502. The inverter 801 outputs an internal signal 80 which is the inverted signal of the input signal IN. The AND gate 502 outputs an internal signal 81. The gate electrode of the pMOS 802 is connected to the output of the OR gate 102, the source electrode thereof is connected to a positive power supply VDD, and the drain electrode thereof is connected to the signal output terminal "out."

The control section sets the output section to the CMOS type by applying the internal input signal 10 to the gate electrodes of the pMOS 103 and the nMOS's 104 and 504 when the control signal OD indicates a first setting. When the control signal OD indicates a second setting, the control section holds the pMOS 103 and the nMOS 504 OFF constantly and applies the internal input signal 10 to the gate electrode of the nMOS 104 so as to turn the output section into the open-drain type which provides a lower driving capability than that available at the first setting. In this case, the first setting applies when the control signal OD is at the low level, and the second setting applies when the control signal OD is at the high level.

The operation of the output circuit of FIG. 8 will be described first. The operation carried out when the control signal OD has been set at the high level will be described first. At this setting, the internal signal 80 from the inverter 801 is at the low level, so that the internal signal 81 issued from the AND gate 502 is fixed to the low level, and the nMOS 504 stays OFF constantly. Hence, the output circuit of FIG. 8 acts the same as the output circuit of FIG. 1 when the control signal OD is at the high level. This means that, if the control signal OD is at the high level, then the output section operates as an nMOS open-drain circuit composed of the nMOS 104.

The operation carried out when the control signal OD has been set at the low level will now be described. At this setting, the OR gate 102 issues the internal input signal 10 from the inverter 101 as the internal signal 11, and the internal signal 11 becomes the inverted signal of the input signal IN. The AND gate 502 issues the internal input signal 10 from the inverter 101 as the internal signal 81, and the internal signal 81 becomes the inverted signal of the input signal IN. Hence, when the input signal IN switches to the low level, the pMOS 802 turns OFF, the nMOS's 104 and 504 turn ON. When the input signal IN switches to the high level, the pMOS 802 turns ON, while the nMOS's 104 and 504 turn OFF. Thus, if the control signal OD is at the low level, then the output section operates as a CMOS circuit composed of the pMOS 802 and nMOS's 104 and 504. The output circuit of FIG. 8 is characterized by that the driving capability of the nMOS working in the CMOS circuit is higher than that of the nMOS working in the nMOS open-drain circuit, which is opposite from the case of the output circuit of FIG. 7.

As set forth above, the eighth embodiment is equipped with the control section which has an OR gate 102 (the first logic gate) for controlling the pMOS 802 (the first MOS transistor), and the inverter 801 and the AND gate 502 (the second logic gate) for controlling the nMOS 504 (the third MOS transistor), and which applies the internal input signal 10 to the gate electrode of the nMOS 104 (the second MOS transistor). This makes it possible to switch the signal output mode of the output section to the CMOS type or the nMOS open-drain type by the control signal OD. Furthermore, the driving capability at the time of switching the signal output mode can be also switched at the same time. Hence, even if the nMOS of the output section is required to provide a higher driving capability when the output circuit works as the CMOS type output circuit than that when it works as the nMOS open-drain type output circuit, optimum driving capabilities can be set for each type.

The internal composition of the control section and the input mode of the control signals supplied to the control section-are not limited to those illustrated in FIG. 8. The output circuit of FIG. 8 can be also configured to switch between the CMOS type and the pMOS open-drain type.

Thus, the output circuit in accordance with the present invention is provided with the control section so as to switch the signal output mode or the driving capability of the output section in response to the control signals supplied from outside, or to switch the signal output mode and the driving capability of the output section at the same time or independently. This provides an advantage in that the output circuit is able to adapt itself to a plurality of external interfaces, which have different signal output modes and different required driving capabilities, without the need for changing the circuit.

What is claimed is:

1. An output circuit receiving an external input signal and a control signal, comprising:
    an input circuit generating an internal input signal in response to the external signal;
    an output circuit including a first pMOS transistor coupled between a positive potential source and an output terminal and a first nMOS transistor coupled between a reference potential source and the output terminal, a gate of one of the transistors receiving the internal input signal;
    a first control circuit receiving the internal input signal and the control signal and outputting a first internal signal in response to the internal input signal and the control signal to a gate of the other one of the transistors, said first control circuit outputting the internal input signal as the first internal signal when the control signal has a first level, and outputting a predetermined level signal as the first internal signal when the control signal has a second level so that the other one of the transistors has a predetermined state;
    a second nMOS transistor coupled between the reference potential source and the output terminal; and
    a second control circuit receiving the internal input signal and the control signal and outputting a second internal signal in response to the internal input signal and the control signal to a gate of said second nMOS transistor, said second control circuit outputting the internal input signal as the second internal signal when the control signal has the first level and outputting a low level signal as the second internal signal when the control signal has the second level so that said second nMOS transistor is in an OFF state.

2. An output circuit according to claim 1, wherein said input circuit is an inverter.

3. An output circuit according to claim 1, wherein said first control circuit is an OR circuit.

4. An output circuit according to claim 1, wherein said second control circuit includes and an inverter an AND circuit.

5. An output circuit having an input terminal receiving an input signal, a control input terminal receiving a control signal and an output terminal, said output control circuit comprising:
    a first transistor having a first conductivity type, said first transistor including a first terminal connected to the output terminal, a second terminal connected to a first potential source and a control terminal;
    a second transistor having a second conductivity type which is opposite to the first conductivity type, said second transistor including a first terminal connected to the output terminal, a second terminal connected to a second potential source and a control terminal;
    a third transistor having the second conductivity type, said third transistor including a first terminal connected to the output terminal, a second terminal connected to the second potential source and a control terminal, said third transistor turning on and off in response to the input signal; and
    a control circuit connected to the input terminal, the control input terminal and the control terminals of said first and second transistors, said control circuit outputting a first control signal to the control terminal of said first transistor and a second control signal to the control terminal of said second transistor in response to the input signal when the control signal has an active state, said control circuit outputting fixed level signals to the control terminals of said first and second transistors when the control signal has an inactive level.

6. An output circuit according to claim 5, wherein said first and second transistors turn off when the fixed level signals are received thereby.

* * * * *